US012628630B2

(12) United States Patent
Liao et al.

(10) Patent No.: US 12,628,630 B2
(45) Date of Patent: May 12, 2026

(54) INTERCONNECT STRUCTURE WITH REINFORCING SPACER AND METHOD FOR MANUFACTURING THE SAME

(71) Applicant: TAIWAN SEMICONDUCTOR MANUFACTURING COMPANY, LTD., Hsinchu (TW)

(72) Inventors: Wei-Hao Liao, Hsinchu (TW); Hsi-Wen Tien, Hsinchu (TW); Chih-Wei Lu, Hsinchu (TW); Hwei-Jay Chu, Hsinchu (TW); Yu-Teng Dai, Hsinchu (TW); Hsin-Chieh Yao, Hsinchu (TW); Yung-Hsu Wu, Hsinchu (TW); Li-Ling Su, Hsinchu (TW); Chia-Wei Su, Hsinchu (TW); Hsin-Ping Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 399 days.

(21) Appl. No.: 18/486,222

(22) Filed: Oct. 13, 2023

(65) Prior Publication Data

US 2025/0125189 A1      Apr. 17, 2025

(51) Int. Cl.
*H01L 21/768* (2006.01)
*H01L 21/311* (2006.01)
*H01L 23/528* (2006.01)
(52) U.S. Cl.
CPC .. *H01L 21/76802* (2013.01); *H01L 21/31144* (2013.01); *H01L 21/76831* (2013.01); *H01L 21/76877* (2013.01); *H01L 23/528* (2013.01)

(58) Field of Classification Search
CPC ............ H01L 21/02362; H01L 21/311; H01L 21/31144; H01L 21/768; H01L 21/76802; H01L 21/76805; H01L 21/76811; H01L 21/76816; H01L 21/76831; H01L 21/76841; H01L 21/76844; H01L 21/76877; H01L 21/76895; H01L 23/522; H01L 23/5221; H01L 23/5226; H01L 23/528; H01L 23/5283; H01L 23/538
See application file for complete search history.

(56) References Cited

U.S. PATENT DOCUMENTS

2003/0199169 A1* 10/2003  Jun ................... H01L 23/53295
257/E21.252

* cited by examiner

*Primary Examiner* — Cheung Lee
(74) *Attorney, Agent, or Firm* — Birch, Stewart, Kolasch & Birch, LLP

(57) ABSTRACT

A method for manufacturing an interconnect structure includes: forming a first dielectric layer; forming a mask; patterning the first dielectric layer through the mask to form a trench, an inner surface of the trench having two first portions opposite to each other along an X direction, two second portions opposite to each other along a Y direction, and a bottom portion; forming a second dielectric layer over the mask and the patterned first dielectric layer, and along an inner surface of the trench; etching the second dielectric layer by directing an etchant in a predetermined direction such that a first part of the second dielectric layer on the two first portions and the bottom portion is removed, and a second part of the second dielectric layer on the second portions of the trench remains and is formed into two reinforcing spacers; and forming a trench-filling element.

20 Claims, 14 Drawing Sheets

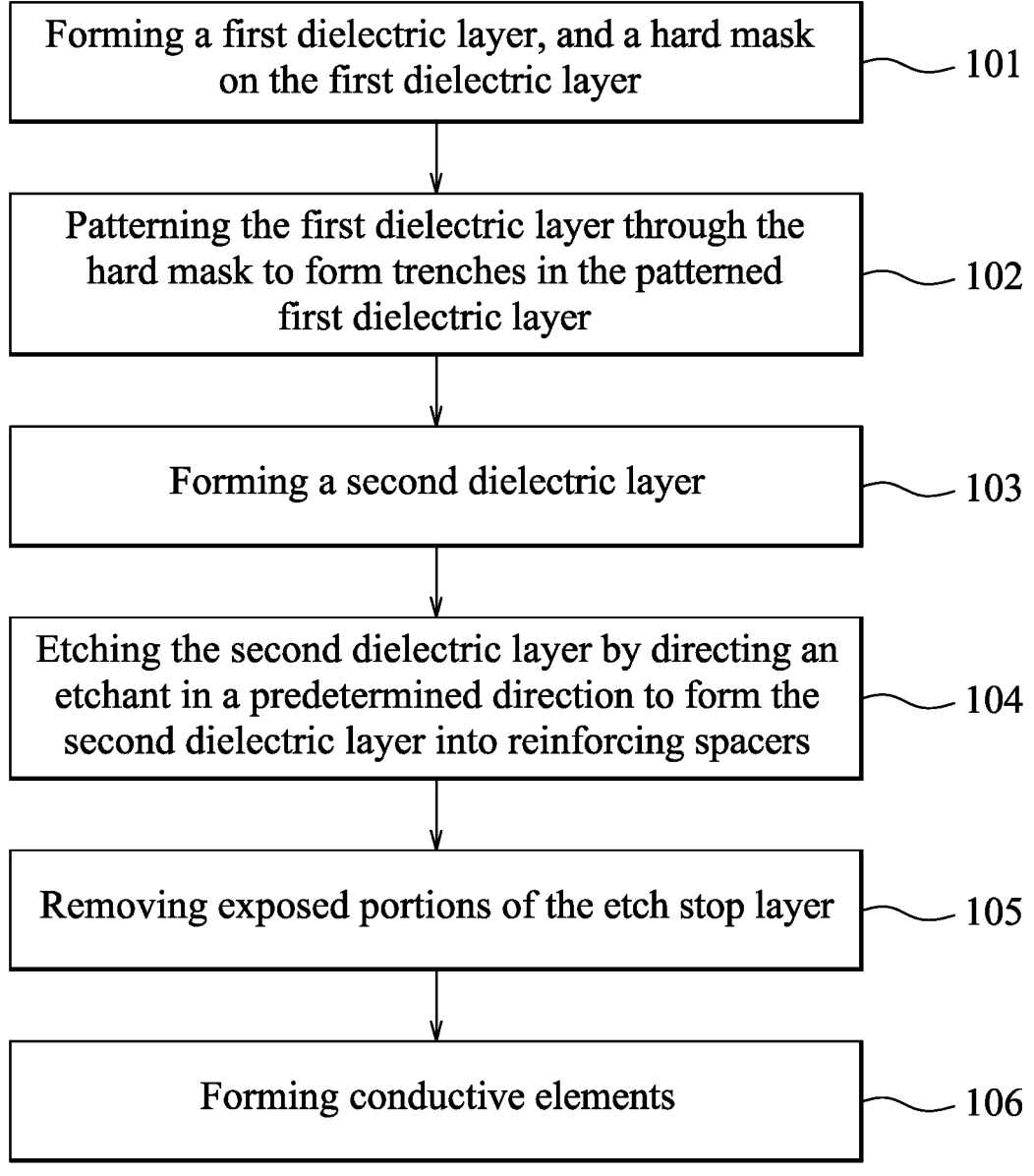

| Forming a first dielectric layer, and a hard mask on the first dielectric layer | 101 |
| Patterning the first dielectric layer through the hard mask to form trenches in the patterned first dielectric layer | 102 |
| Forming a second dielectric layer | 103 |
| Etching the second dielectric layer by directing an etchant in a predetermined direction to form the second dielectric layer into reinforcing spacers | 104 |
| Removing exposed portions of the etch stop layer | 105 |
| Forming conductive elements | 106 |

FIG.1

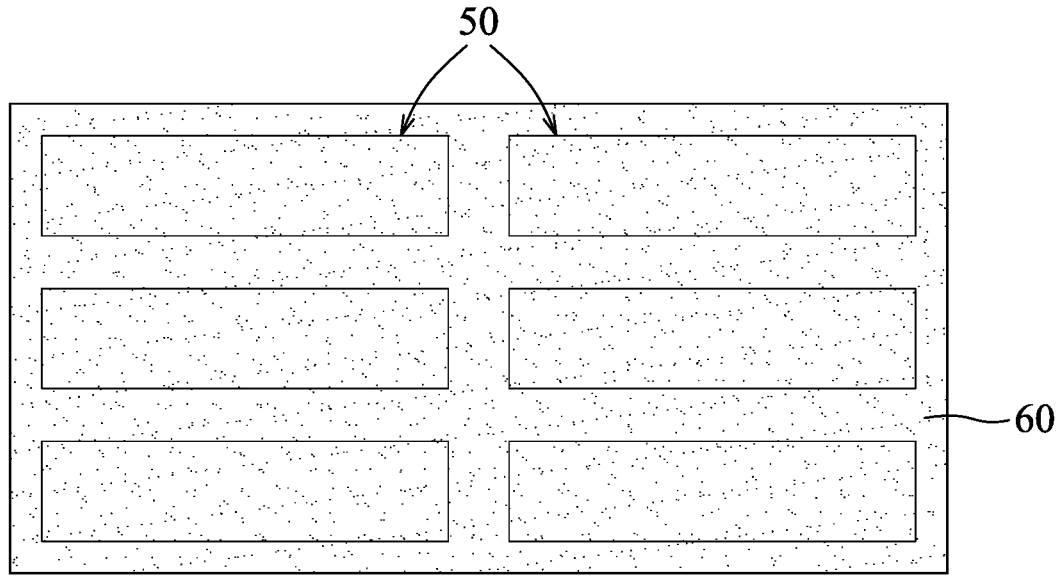
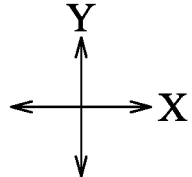
FIG.10

INTERCONNECT STRUCTURE WITH REINFORCING SPACER AND METHOD FOR MANUFACTURING THE SAME

BACKGROUND

In order to meet the demand of shrinkage of device size, metal lines at interconnect structures are designed to be close to each other, causing the interferences from RC delay due to parasitic resistance and capacitance to become greater, resulting in poor device performance. As such, development of interconnect structures with less RC delay is important.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flow diagram illustrating a method for manufacturing an interconnect structure in accordance with some embodiments.

FIGS. 2 to 21 are schematic views illustrating intermediate stages of the method for manufacturing the interconnect structure in accordance with some embodiments.

DETAILED DESCRIPTION

Figure 2:
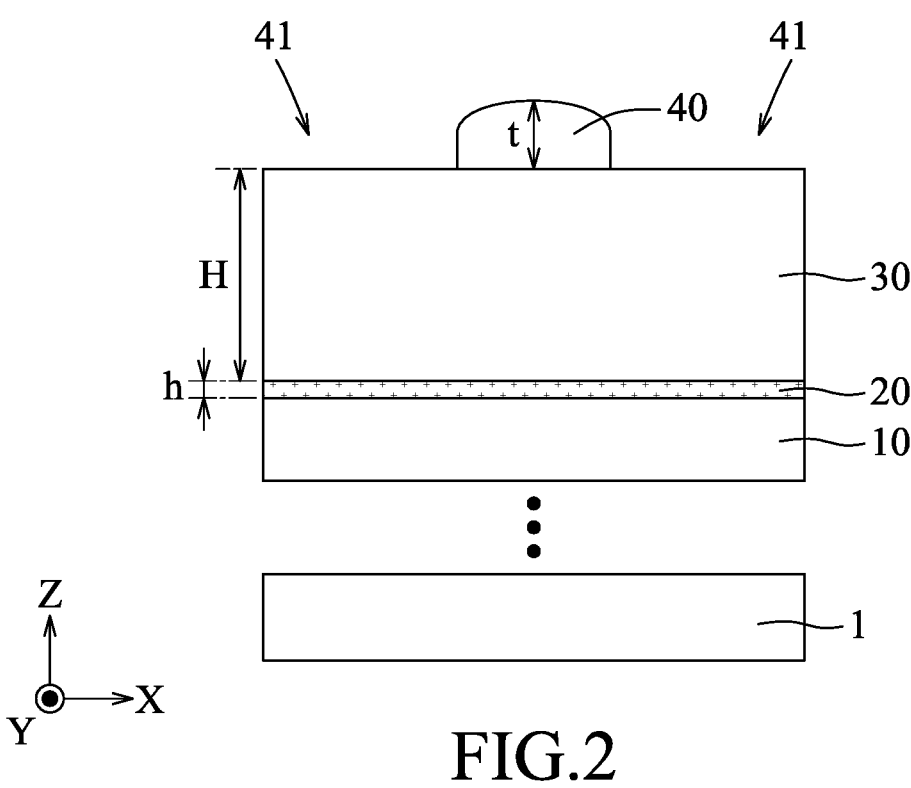

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "bottommost," "upper," "uppermost," "lower," "lowermost," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the purposes of this specification and appended claims, unless otherwise indicated, all numbers expressing amounts, sizes, dimensions, proportions, shapes, formulations, parameters, percentages, quantities, characteristics, or other numerical values used in the specification and claims, are to be understood as being modified in all instances by the term "about" even if the term "about" is not explicitly recited with the values, amounts or ranges. Accordingly, unless indicated to the contrary, the numerical parameters set forth in the following specification and appended claims are not and need not be exact, but may be approximations and/or larger or smaller than specified as desired, may encompass tolerances, conversion factors, rounding off, measurement error, and other factors known to those of skill in the art depending on the desired properties sought to be obtained by the presently disclosed subject matter. For example, the term "about," when used with a value, can capture variations of, in some aspects ±10%, in some aspects +5%, in some aspects ±2.5%, in some aspects ±1%, in some aspects ±0.5%, and in some aspects ±0.1% from the specified amount, as such variations are appropriate to perform the disclosed methods or employ the disclosed compositions.

The present disclosure is directed to an interconnect structure, and a method for manufacturing the same. The interconnect structure includes conductive elements, such as metal lines, that are formed in a patterned first dielectric layer and arranged in an array along an X direction and a Y direction. The X direction and the Y direction are transverse to each other. Each of the conductive elements has two first surfaces, each confronting an adjacent one of the conductive elements in the X direction, and two second surfaces, each confronting an adjacent one of the conductive elements in the Y direction. The interconnect structure also includes multiple pairs of reinforcing spacers. Each pair of the reinforcing spacers is respectively formed on the two second surfaces of a respective one of the conductive elements, and is formed between the patterned first dielectric layer and the respective one of the conductive elements, such that the two first surfaces of each of the conductive elements are directly connected to the patterned first dielectric layer. The reinforcing spacers have a comparatively low dielectric constant, such as not greater than about 4, and are beneficial in keeping the capacitance between adjacent ones of the metal lines along the Y direction low, especially in the case that the metal lines are densely packed along the Y direction. In addition, the disposal of the reinforcing spacers may be useful in adjusting a critical dimension of a width of the metal lines measured along the Y direction.

FIG. 1 is a flow diagram illustrating a method for manufacturing the interconnect structure in accordance with some embodiments. FIGS. 2 to 19 illustrate schematic views of intermediate stages of the method in accordance with some embodiments. Some repeating structures are omitted in FIGS. 2 to 19 for the sake of brevity. Additional steps can be provided before, after or during the method, and some of the steps described herein may be replaced by other steps or be eliminated.

Figure 3:
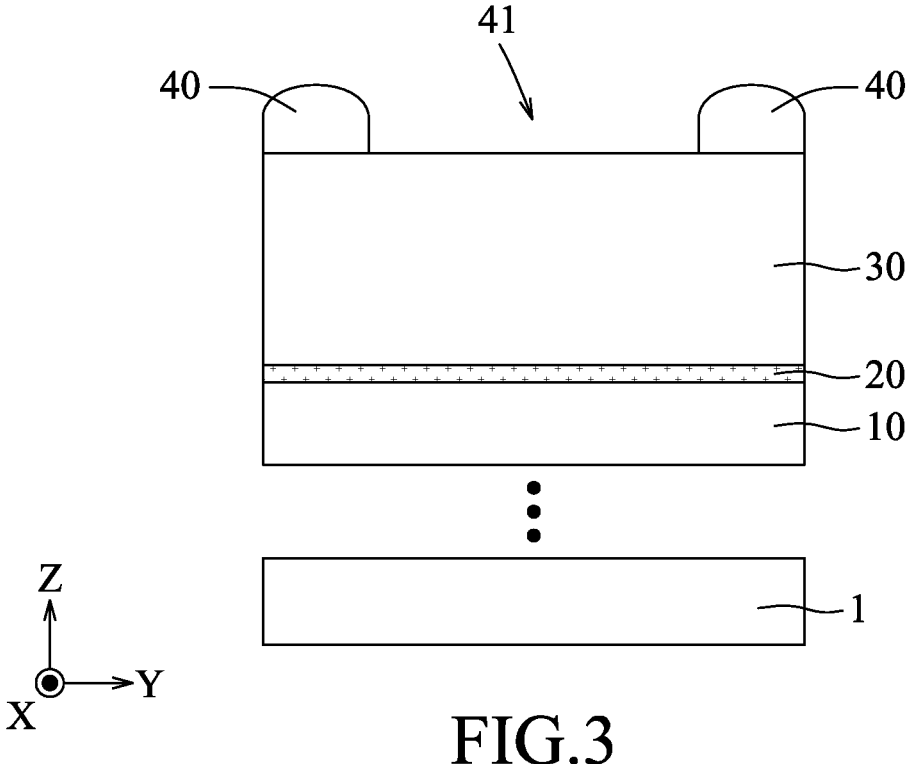
Figure 4:
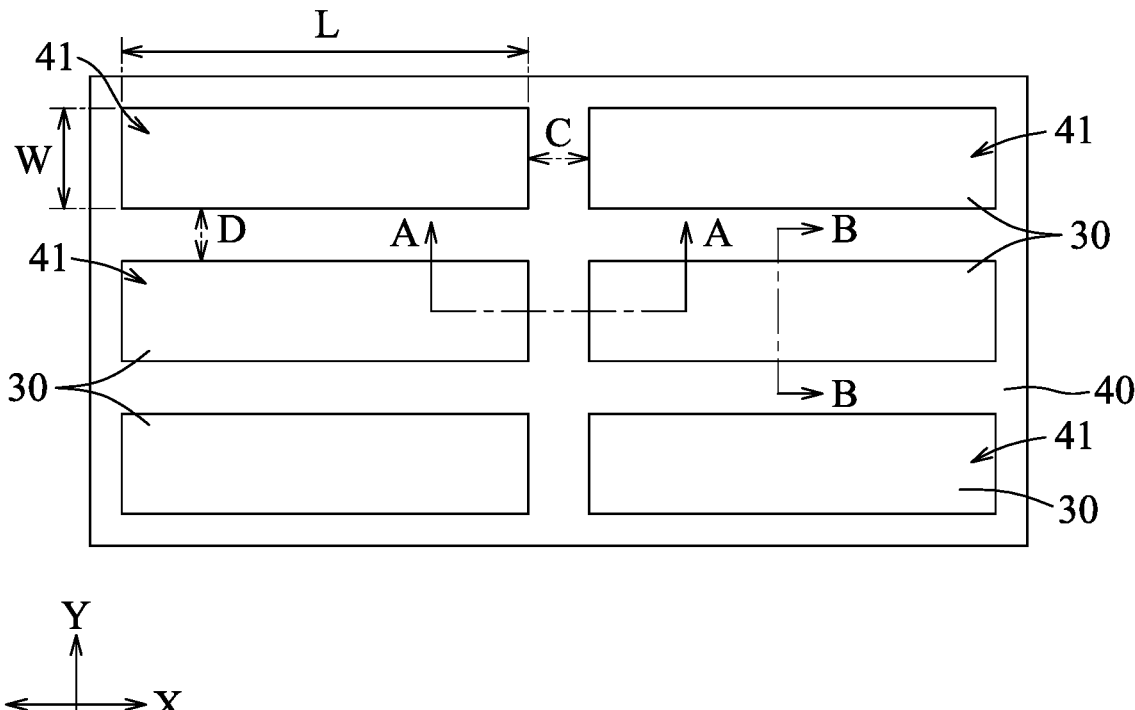

Referring to FIG. 1 and the example illustrated in FIGS. 2 to 4, the method begins at step 101, where a first dielectric layer 30 is formed on a base structure, and a hard mask 40 is formed on the first dielectric layer 30. FIG. 4 is a top view of the structure after completing step 101, while FIG. 2 is a cross-sectional view of the structure taken along the line A-A shown in FIG. 4. FIG. 3 is a cross-sectional view of the structure taken along the line B-B shown in FIG. 4. FIGS. 2 and 3 are respectively known as an X-cut and a Y-cut of the structure after completing step 101.

Referring to FIGS. 2 and 3, the base structure includes a substrate 1, a front-end-of-line (FEOL) section (not shown), and a back-end-of-line (BEOL) section disposed on the FEOL section opposite to the substrate 10. The interconnect structure of the present disclosure is formed in the BEOL section.

The substrate 1 may be made of a low k dielectric material. In some embodiments, the substrate may be made of elemental semiconductor materials, such as crystalline silicon, diamond, or germanium; compound semiconductor materials, such as silicon carbide, gallium arsenide, indium arsenide, or indium phosphide; or alloy semiconductor materials, such as silicon germanium, silicon germanium carbide, gallium arsenide phosphide, or gallium indium phosphide. The material for forming the substrate 1 may be doped with p-type impurities or n-type impurities, or undoped. In addition, the substrate 1 may be a bulk silicon substrate, a silicon-on-insulator (SOI) substrate, or a germanium-on-insulator (GOI) substrate. Other suitable materials for the substrate 1 are within the contemplated scope of disclosure. In the following drawings, the substrate 1 is not shown.

The FEOL section may include any suitable elements such as active devices (for example, transistors such as fin-type field-effect transistors (FinFET), nanosheet semiconductor devices (e.g. gate-all-around field-effect transistors (GAAFET), forksheet field-effect transistors, complementary field-effect transistors (CFET), or the like), passive devices (for example, capacitors, resistors, or the like), decoders, amplifiers, other suitable devices, and combinations thereof. Other suitable elements for the FEOL part are within the contemplated scope of disclosure.

The BEOL section includes an interlayer dielectric (ILD) 10, an etch stop layer (ESL) 20 disposed on the FEOL section, and may optionally include other suitable configuration(s) not shown in FIGS. 2 and 3.

The ILD 10 may include a low k dielectric material, such as carbon-doped silicon oxide ($SiO_xC_y$), silicon carbon nitride ($SiC_xN_y$), boron carbon nitride ($BC_xN_y$), silicon oxide ($SiO_x$), silicon nitride ($SiN_x$), silicon carbide ($SiC_x$), silicon oxynitride ($SiO_xN_y$), carbon-doped hydrogenated silicon oxide ($SiO_xC_yH_z$), spin-on glass (SOG), amorphous fluorinated carbon, fluorosilicate glass (FSG), xerogel, aerogel, polyimide, parylene, bis-benzocyclobutenes, non-porous materials, porous materials, or the like, or combinations thereof. Other suitable materials for forming the ILD 10 are within the contemplated scope of disclosure.

The ESL 20 may include an aluminum-based material (e.g., aluminum oxide (AlO), aluminum oxynitride ($AlO_xN_y$), aluminum nitride ($AlN_x$)), silicon carbide ($SiC_x$), silicon nitride ($SiN_x$), silicon carbon nitride ($SiC_xN_y$), silicon oxynitride ($SiO_xN_y$), and may be doped with hafnium (Hf), zirconium (Zr), yttrium (Y). Other suitable materials for forming the ESL 20 are within the contemplated scope of disclosure. In some embodiments, the ESL 20 is made of the aluminum-based material. In certain embodiments, the ESL 20 may have a thickness (h) ranging from about 10 nm to about 50 nm.

The first dielectric layer 30 may include a material similar to that of the ILD 10, and details thereof are omitted for the sake of brevity. In some embodiments, the first dielectric layer 30 may have a dielectric constant (k) value not greater than 7, such as ranging from about 2.8 to about 4. In other embodiments, the first dielectric layer 30 may be a porous material. In some embodiments, the first dielectric layer 30 may be formed with a height (H) measured along a Z direction ranging from about 200 Å to about 800 Å. The Z direction is transverse to both the X and Y directions. In some embodiments, the X, Y and Z directions are perpendicular to one another.

The ILD 10, the ESL 20 and the first dielectric layer 30 may each be formed by one or more deposition processes (such as chemical vapor deposition (CVD), atomic layer deposition (ALD), other suitable processes, or combinations thereof.

The hard mask 40 may be formed by the following sub-steps: (i) forming a hard mask material layer (not shown) by CVD, or ALD, or the like, or combinations thereof; (ii) forming a photoresist material layer (not shown); (iii) developing the photoresist material layer to form a patterned photoresist mask (not shown); (iv) patterning the hard mask material layer into the hard mask 40 through the patterned photoresist mask; and (v) removing the patterned photoresist mask. The hard mask material layer may include titanium nitride (TiN), tungsten-doped carbon (WdC), ruthenium (Ru), titanium oxide (TIO), tantalum nitride (TaN), tantalum (Ta), tungsten (W), molybdenum (Mo), chromium (Cr), silicon oxide ($SiO_x$), or the like, or combinations thereof. In some embodiments, the hard mask 40 is formed with a thickness (t) ranging from about 150 Å to about 300 Å. Other suitable materials and/or methods for forming the hard mask 40 are within the contemplated scope of disclosure.

The hard mask 40 is formed with openings 41 which expose portions of the first dielectric layer 30 underneath, and which define positions of trenches 50 (see FIGS. 5 to 7), and thus positions of conductive elements 70 (see FIGS. 17 to 19) formed in subsequent steps. The hard mask 40 not only serves as a patterning mask for forming the trenches 50, and, but also as a protection mask for protecting the first dielectric layer 30 (or the patterned first dielectric layer 31, see FIGS. 11 to 13) underneath in the following steps.

Arrangement, and/or number, and/or dimensions of the openings 41 of the hard mask 40 may be determined according to practical requirements. In the exemplary embodiment shown in FIG. 4, the openings 41 are arranged in an array including three rows and two columns, but are not limited thereto. In each of the three rows, along the X direction, two openings 41 are formed and are spaced apart from each other by a distance (C). In each of the two columns, along the Y direction, three openings 41 are formed and are spaced apart from each other by a distance (D). In some embodiments, the distance (D) is less than than the distance (C), such that the conductive elements 70 formed along the Y direction are more densely packed than those along the X direction. In certain embodiments, the distance (C) ranges from about 30 nm to about 100 nm, and the distance (D) ranges from about 10 nm to about 20 nm. In accordance with some embodiments, each of the openings 41 has a width (W) measured along the Y direction ranging from about 8 nm to about 30 nm, and a length (L) measured along the X direction ranging from about 1 μm to about 20 μm. Other suitable arrangement, and/or number, and/or dimension ranges of the openings 41, and/or ranges of the distances (C) and (D) are within the contemplated scope of disclosure.

Figures 5, 6:
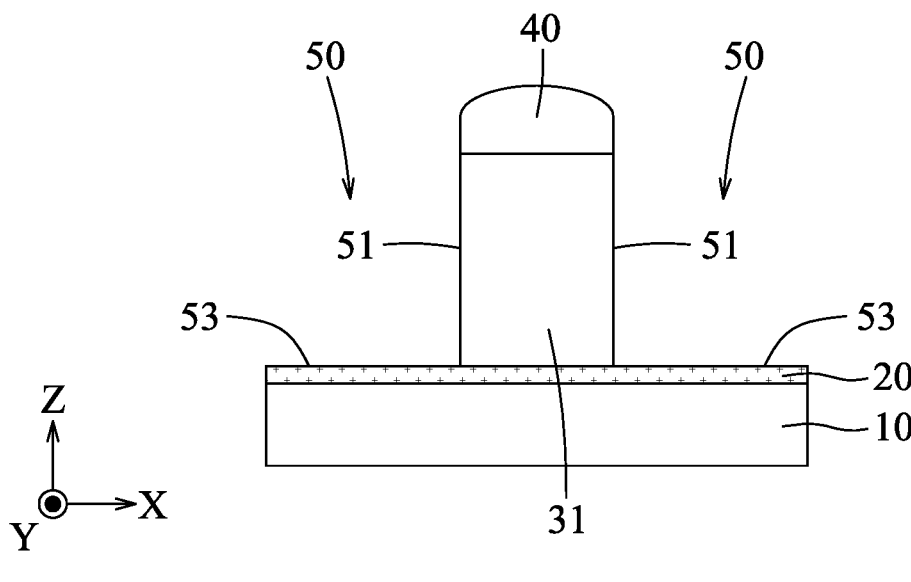
Figure 7:
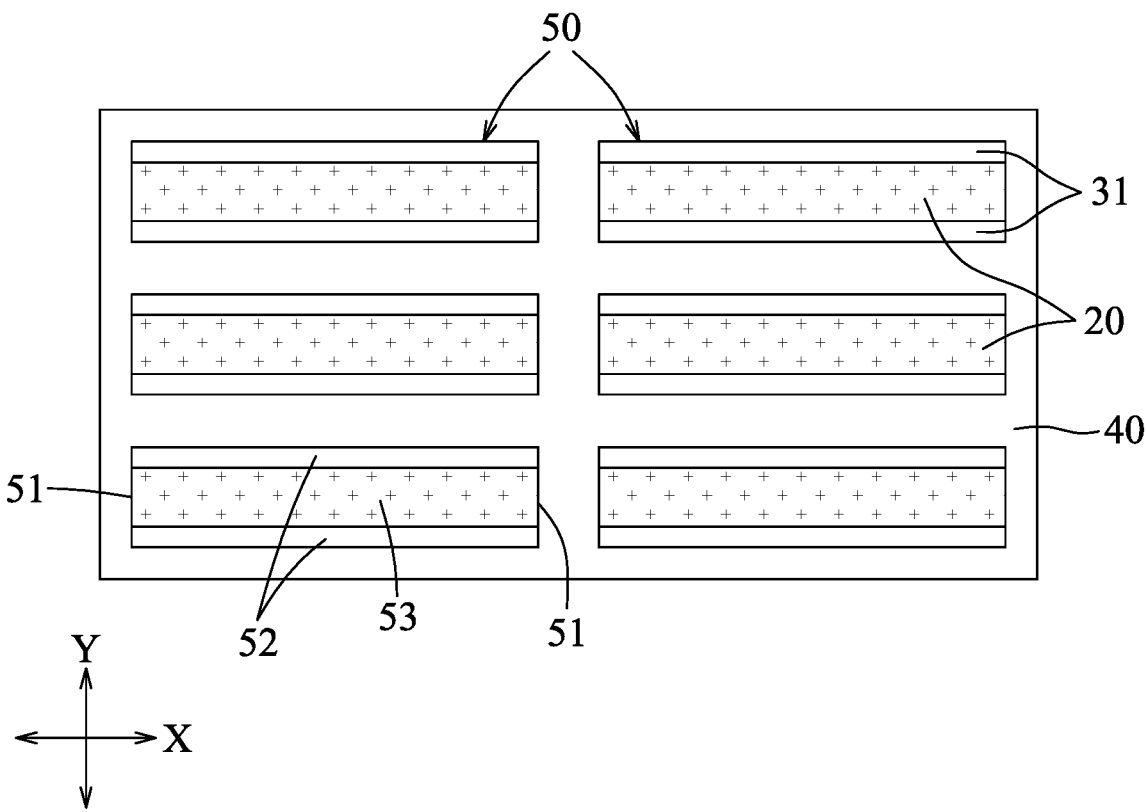

Referring to FIG. 1 and the example illustrated in FIGS. 5 to 7, the method proceeds to step 102, where the first dielectric layer 30 is patterned through the openings 41 of the hard mask 40 (see FIGS. 2 to 4) to form a plurality of trenches 50 in the patterned first dielectric layer 31. FIGS. 5 to 7 show the structure respectively subsequent to those shown in FIGS. 2 to 4, and are respectively the X-cut, the Y-cut and the top view of the structure after completing step 102.

Patterning of the first dielectric layer 30 into the patterned first dielectric layer 31 may be performed by any suitable processes, such as, but not limited to, an etching process (e.g., dry etching, wet etching, or a combination thereof). In some embodiments, the first dielectric layer 30 is patterned using a dry etching involving an ion bombardment process.

In some embodiments, each of the trenches 50 extends from an upper surface of the patterned first dielectric layer 31 to a bottom surface of the patterned first dielectric layer 31. An inner surface of each of the trenches 50 has two first portions 51 opposite to each other along the X direction, two second portions 52 opposite to each other along the Y direction, and a bottom portion 53. In accordance with some embodiments, the first and second portions 51, 52 are bordered by the patterned first dielectric layer 31, while the bottom portion 53 is bordered by the etch stop layer 20 of the base structure. Each of the trenches 50 is formed with a top width (TW) and a bottom width (BW) (measured along the Y direction). In certain embodiments, the top width (TW) ranges from about 8 nm to about 30 nm, and the bottom width (BW) ranges from about 6 nm to about 30 nm. In some embodiments, as shown in FIG. 5, each of the two first portions 51 may be formed normal to the bottom portion 53. In some embodiments, as shown in FIG. 6, the two second portions 52 may form an angle (0) with the bottom surface of the patterned first dielectric layer 31, and the angle (0) may range from about 80° to about 90°. The angle (0) may be varied depending on material of the patterned first dielectric layer 31 and practical needs. In some embodiments, the angle (0) is an acute angle, and each of the trenches 50 is formed with a trapezium cross section having the top width (TW) larger than the bottom width (BW). In other embodiments, the angle (0) is a right angle, i.e., the second portions 52 are normal to the bottom surface of the patterned first dielectric layer 31.

It is noted that the patterning process performed in step 102 may unavoidably cause damages to the inner surface of each of the trenches 50 in the patterned first dielectric layer 31, resulting in damage of the patterned first dielectric layer 31 and an increment of the dielectric constant (k) value thereof (such as increasing from not greater than about 4 to approximately 6 to 7). In such case, an interconnect structure including the damaged patterned first dielectric layer 31 may undesirably have a relatively high capacitance and thus RC delay, especially when the conductive elements 70 formed in subsequent step are densely packed along the Y-direction.

Figures 8, 9:
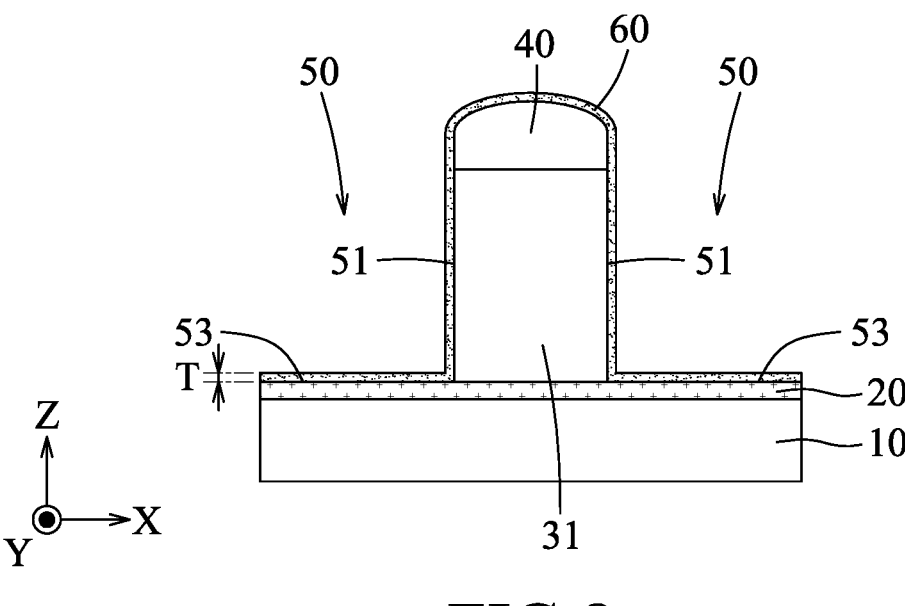

Referring to FIG. 1 and the example illustrated in FIGS. 8 to 10, the method proceeds to step 103, where a second dielectric layer 60 is formed over the mask 40, the patterned first dielectric layer 31, and along the inner surface of each of the trenches 50. FIGS. 8 to 10 show the structure respectively subsequent to those shown in FIGS. 5 to 7, and are respectively the X-cut, the Y-cut and the top view of the structure after completing step 103.

The second dielectric layer 60 may include a material similar to that of the ILD 10, and details thereof are omitted for the sake of brevity. The second dielectric layer 60 may include a material same as, or different from that of the first dielectric layer 30 (see FIGS. 2 to 4). The second dielectric layer 60 may have a dielectric constant (k) value not greater than about 4.0, such as ranging from about 2.8 to about 4.0, or approximately 2.8, or approximately 3.2. In some embodiments, the second dielectric layer 60 may have a thickness (T) ranging from about 10 Å to about 200 Å. The second dielectric layer 60 may be formed by any suitable processes, such as CVD, ALD, or the like, or combinations thereof, but are not limited thereto. In accordance with some embodiments, the ALD process is adopted, such that the second dielectric layer 60 is formed in a conformal manner, especially along the inner surface of each of the trenches 50.

Other suitable materials and/or processes for making the second dielectric layer 60 are within the contemplated scope of the present disclosure.

Figure 11:
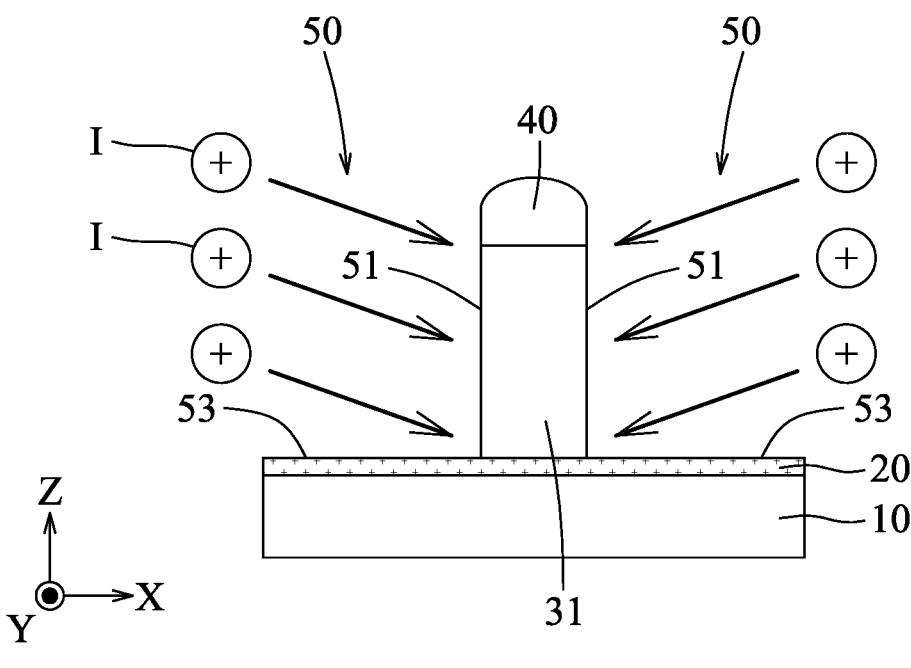
Figure 12:
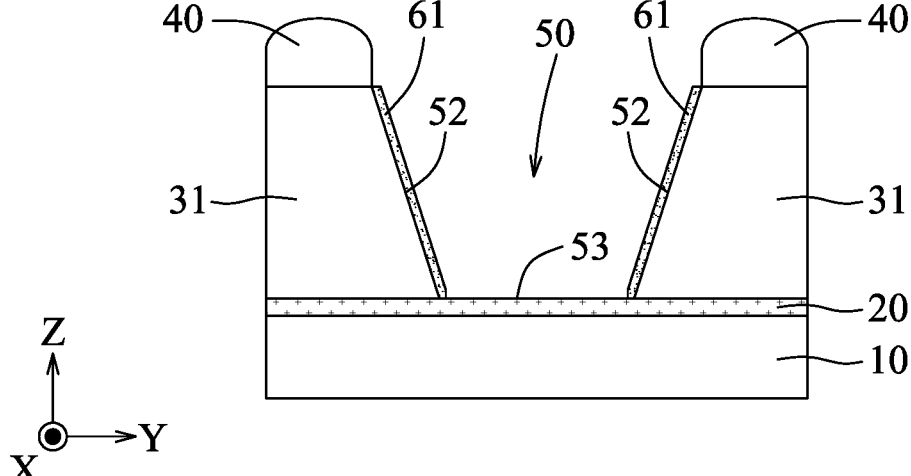
Figure 13:
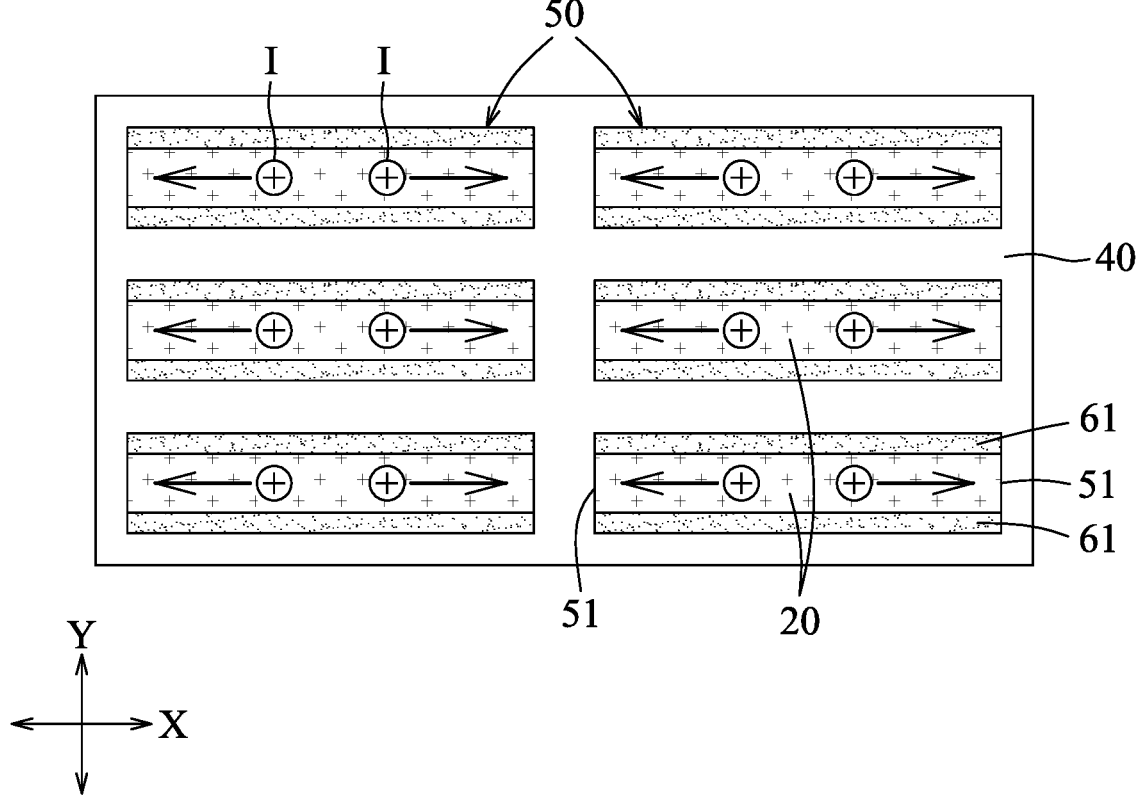

Referring to FIG. 1 and the example illustrated in FIGS. 11 to 13, the method proceeds to step 104, where the second dielectric layer 60 (see FIGS. 8 to 10) is etched to form reinforcing spacers 61. Specifically, for each of the trenches 50, a first part of the second dielectric layer 60 that is located on the first portions 51 and the bottom portion 53 are removed, while a second part of the second dielectric layer 60 that is located on the second portions 52 remain and is formed into the reinforcing spacers 61. In addition, a third part of the second dielectric layer 62 that is formed on the hard mask 41 is also removed in step 104. FIGS. 11 to 13 show the structure respectively subsequent to those shown in FIGS. 8 to 10, and are respectively the X-cut, the Y-cut and the top view of the structure after completing step 104.

The etching process is a directional etching process, and is performed by directing an etchant in a predetermined direction (see the arrows shown in FIGS. 11 and 13). Specifically, the etchant is directed toward the first part of the second dielectric layer 60 located on the first portions 51 and the bottom portion 53. In some embodiments, the etchant is directed along the X direction, or along a XZ plane. The first part of the second dielectric layer 60 located on each of the first portions 51 and the bottom portion 53 is substantially perpendicular to the XZ plane (i.e., the first part of the second dielectric layer 60 is arranged to confront the etchant), and is subjected to the directional etching so as to be removed. The second part of the second dielectric layer 60 located on the second portions 52 is substantially parallel to, or has a small intersecting angle (less than 10°, depending on the angle (0) formed between the second portions 52 and the bottom surface of the patterned first dielectric layer 31) with the XZ plane, and is substantially not affected by the etchant, thus may remain intact. In some embodiments, in the directional etching process, a ratio of a first etching rate of the second dielectric layer 60 along the X direction, or the Z direction, or the XZ plane to a second etching rate of the second dielectric layer 60 along the Y direction is greater than about 10, i.e., the ratio of the first etching rate to the second etching rate is approximately greater than 10:1. The first etching rate may also refer to an etching rate of the first part of the second dielectric layer 60 located on the first portions 51 and the bottom portion 53. The second etching rate may also refer to an etching rate of the second part of the second dielectric layer 60 located on the second portions 52. That is, the etching process has a higher selectivity (higher etching rate) along the predetermined direction (e.g., the X direction) relative to the other direction (e.g., the Y direction). In rare cases, the etchant reaching the first part of the second dielectric layer 60 located on the first portions 51 and the bottom portion 53 may be reflected and be directed toward the second part of the second dielectric layer 60 located on the second portions 52, causing the second part of the second dielectric layer 60 located on the second portions 52 to be slightly etched. In such case, the reinforcing spacers 61 formed therefrom may have a reduction of thickness that is less than about 50 Å.

The directional etching process is an ion beam etching process, or a reactive ion etching process, or the like. Other suitable directional etching processes are within the contemplated scope of the present disclosure. In accordance with some embodiments, ion beam etching process is adopted for generating an ion beam which serves as the etchant and which includes, for example, positively charged ions (I) shown in FIGS. 11 and 13. Parameters and working conditions of the directional etching process, such as the predetermined direction of the etchant, may be adjusted according to practical needs. In addition, power may range from about 100 W to about 3000 W, so that the ion beam generated is sufficient to performing the etching process. If the power is too large, the etchant used (will be discussed later), such as a carbon-based etchant, may be dissociated and deposited on the second dielectric layer 60 or on the inner surface of each of the trenches 50. Bias may range from about 0 V to about 20 kV. A distance between a wafer (not shown, which includes the structure shown in FIGS. 8 to 10) and a source (from which the ion beam is generated) may range from about 1 mm to about 20 mm. A holder (not shown, for holding the wafer), such as an electrostatic chunk, but is not limited thereto, may rotate to facilitate the directional etching performed by the ion beam. A gas for generating the ion beam may include a co-flow species and an etching species. The co-flow species may be helium (He), neon (Ne), krypton (Kr), argon (Ar), nitrogen ($N_2$), or the like, or combinations thereof, but are not limited thereto. The etching species may be tetrafluoromethane ($CF_4$), trifluoromethane ($CF_3$), fluoromethane ($CH_3F$), difluoromethane ($CH_2F_2$), octafluorocyclobutane ($C_4F_8$), hexafluorobutadiene ($C_4F_6$), sulfur (VI) fluoride ($SF_6$), oxygen ($O_2$), or the like, or combinations thereof, but are not limited thereto. Other suitable materials serving as the co-flow species and/or etching species are within the contemplated scope of the present disclosure. Other suitable parameters and/or working conditions and/or processes for performing the directional etching process are within the contemplated scope of the present disclosure.

In the etching process, it is beneficial to etch the first part of the second dielectric layer 60 located on the first portions 51 and the bottom portion 53 and the third part of the second dielectric layer located on the hard mask 40, and to keep other elements of the structure shown in FIGS. 8 to 10, such as the hard mask 40, and the etch stop layer 20 of the base structure intact. The hard mask 40 serves as a protection mask to the patterned first dielectric layer 31 underneath. In a case that the hard mask 40 is undesirably etched and causes the patterned first dielectric layer 31 underneath to be exposed, during formation of conductive elements 70 (in the trenches 50) in subsequent steps, a conducting material (for forming the conductive elements 70) will also be formed directly on the exposed patterned first dielectric layer 31 outside the trenches 50 to connect two adjacent ones of the conductive elements 70, resulting in undesirable current leakage between the connected ones of the conductive elements 70.

In some embodiments, a ratio of an etching rate of the first part of the second dielectric layer 60 located on the first portions 51 and the bottom portion 53 to an etching rate of the hard mask 40 is greater than about 5, i.e., the ratio of the etching rate of the first part to the etching rate of the hard mask 40 is approximately greater than 5:1. That is, the etchant may have a higher selectivity (greater than about 5) to the first part of the second dielectric layer 60 relative to the hard mask 40. In other embodiments, a ratio of an etching rate of the first part of the second dielectric layer 60 to an etching rate of the etch stop layer 20 is greater than about 7, i.e., the ratio of the etching rate of the first part to the etching rate of the etch stop layer 20 is approximately greater than 7:1. That is, the etchant may have a higher selectivity (greater than about 7) to the first part of the second dielectric layer 60 relative to the etch stop layer 20. In yet other embodiments, other ratio ranges (selectivity) are also within the contemplated scope of the present disclosure.

For instance, when the design of the interconnect structure allows the hard mask 40 to have a greater thickness (t) (see FIG. 2), or a greater thickness (h) of the etch stop layer 20, the selectivity requirement may be less strict.

The second part of the second dielectric layer 60 disposed on the second portions 52 is arranged substantially parallel to the predetermined direction of the etchant and therefore is substantially not affected by the etchant. As such, the second part of the second dielectric layer 60 remain intact and is formed into the reinforcing spacers 61 that are respectively disposed on the second portions 52. That is, the reinforcing spacers 61 are present in the inner surface of each of the trenches 50 along the Y direction. The reinforcing spacers 61 are not subjected to the etching process for forming the trenches 50 (step 102) and are substantially not affected by the etchants used in the directional etching process (step 104), and thus are intact, and maintain a relatively low dielectric constant (k) value thereof. The reinforcing spacers 61 have a dielectric constant (approximately 2.8 to 4) lower than that of the damaged patterned first dielectric layer 31 (approximately 6 to 7). In addition, even though the damaged patterned first dielectric layer 31, which is formed from the first dielectric layer 30 (see FIGS. 2 to 4), and the reinforcing spacers 61, which are formed from the second dielectric layer 60 (see FIGS. 8 to 10), are made of the same material in accordance with some embodiments (but is not limited thereto), the reinforcing spacers 61 may still have a dielectric constant value lower than that of the damaged patterned first dielectric layer 31. Such reinforcing spacers 61 covers and reinforces the damaged patterned first dielectric layer 31 so as to permit the damaged patterned first dielectric layer 31 together with the reinforcing spacers 61 to provide a reduced dielectric constant along the Y direction. As such, in comparison with an interconnect structure without the reinforcing spacers 61, the interconnect structure of the present disclosure including the reinforcing spacers 61 may have a lower capacitance, especially along the Y direction which is densely packed with the conductive elements 70, and thus a reduced RC delay.

After completing step 104, as shown in FIGS. 11 to 13, the second dielectric layer 60 (see FIGS. 8 to 10) is formed into the reinforcing spacers 61. In addition, the patterned first dielectric layer 31 and the etch stop layer 20 are respectively exposed from the first portions 51 and the bottom portion 53 of the trenches 50.

Figure 14:
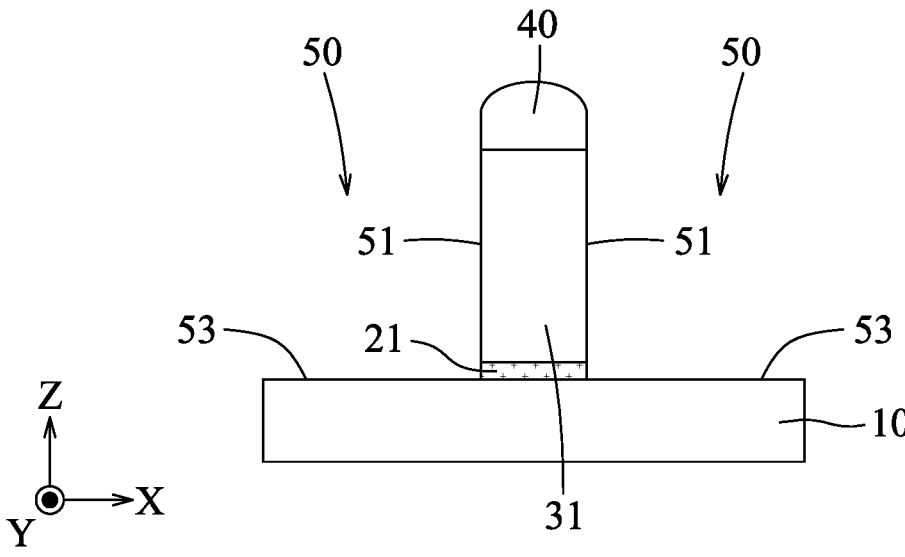
Figure 15:
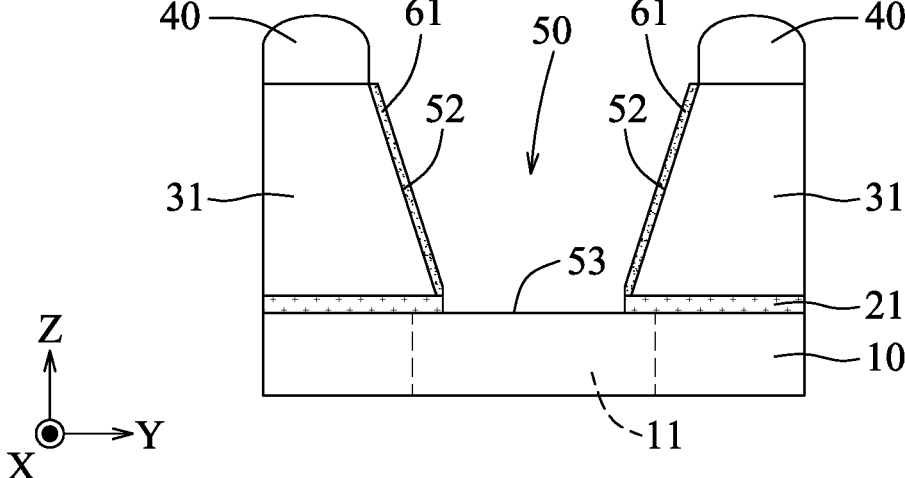
Figure 16:
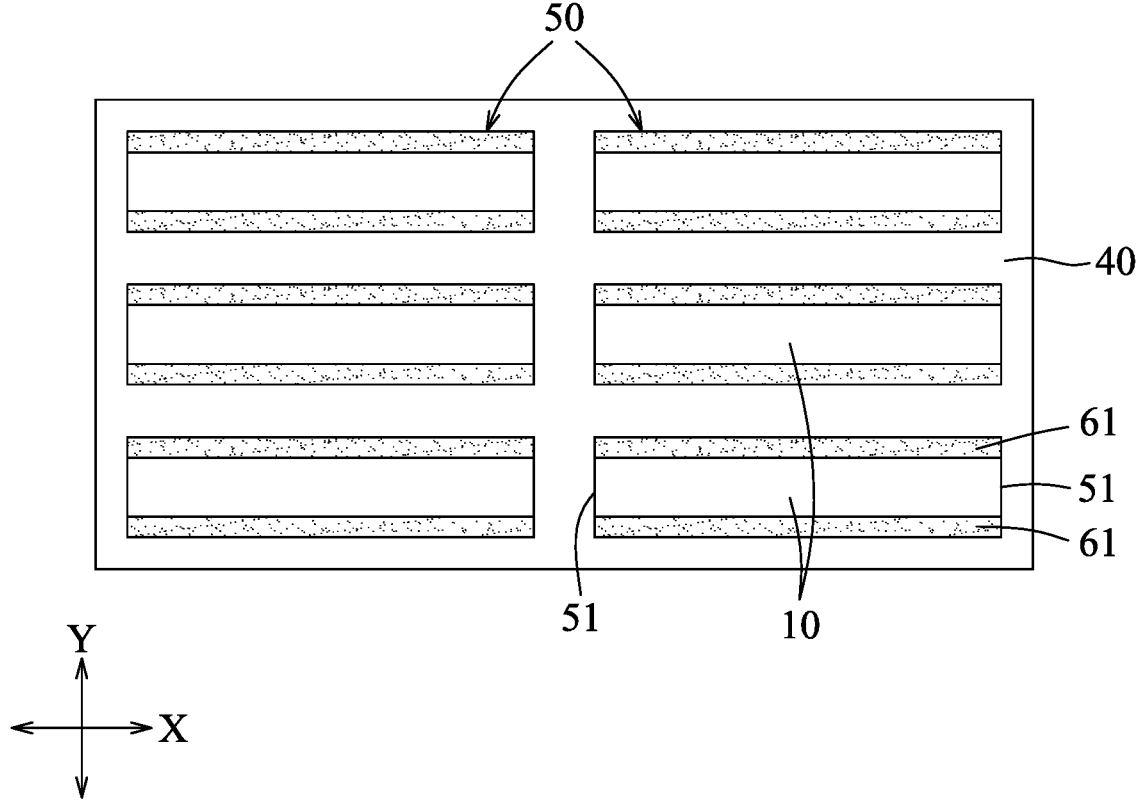

Referring to FIG. 1 and the example illustrated in FIGS. 14 to 16, the method proceeds to step 105, where the exposed portions of the etch stop layer 20 (see FIGS. 11 to 13) are removed to form the patterned etch stop layer 21. FIGS. 14 to 16 show the structure respectively subsequent to those shown in FIGS. 11 to 13, and are respectively the X-cut, the Y-cut and the top view of the structure after completing step 105.

The removing process may be performed by any suitable processes, such as an etching process, e.g., a wet etching process, but is not limited thereto. In some embodiments, the etching process may be a wet cleaning process using chemicals (such as hydrogen peroxide ($H_2O_2$), hydrogen fluoride (HF), or other suitable chemicals) that remove the aluminum-based ESL 20, and that substantially do not cause damages to the patterned first dielectric layer 31 or the reinforcing spacers 61.

After completing step 105, an underlying element of the base structure that is originally covered by the etch stop layer 20, is exposed from the trenches 50. In the exemplary example shown in FIGS. 14 to 16, a portion of the ILD 10 is exposed from each of the trenches 50 for bordering the bottom portion 53 of the inner surface of each of the trenches 50. In some embodiments, metal vias 11 (see FIG. 15, one of which is shown) or other suitable features (not shown) are embedded in the ILD 10, and are exposed from the trenches 50.

Figure 17:
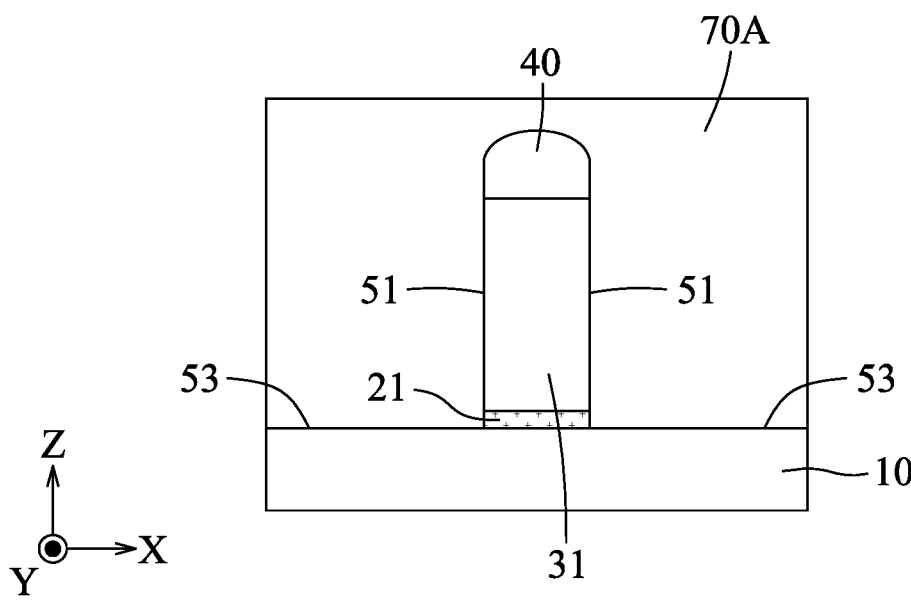
Figure 18:
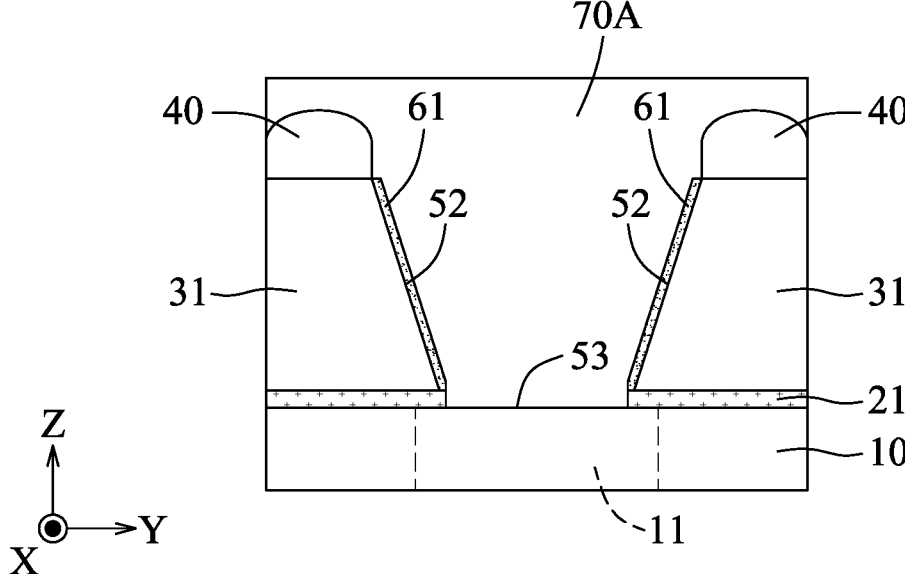
Figures 19, 20:
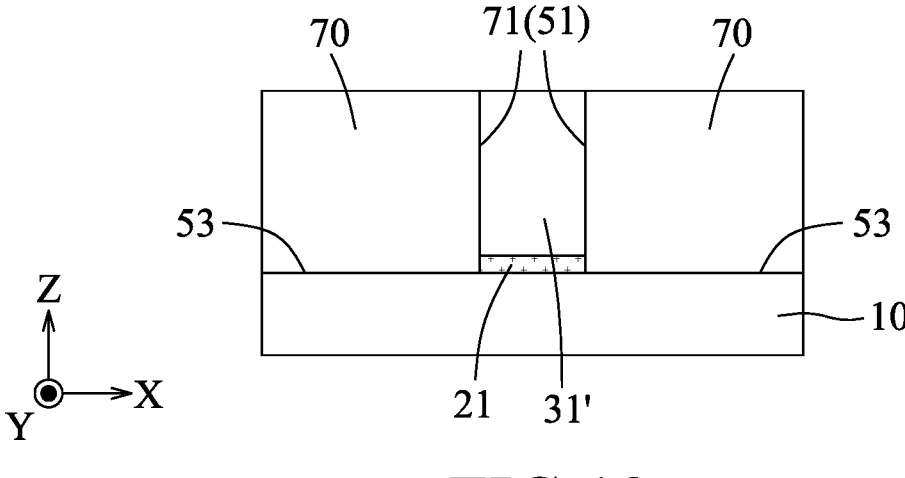
Figure 21:
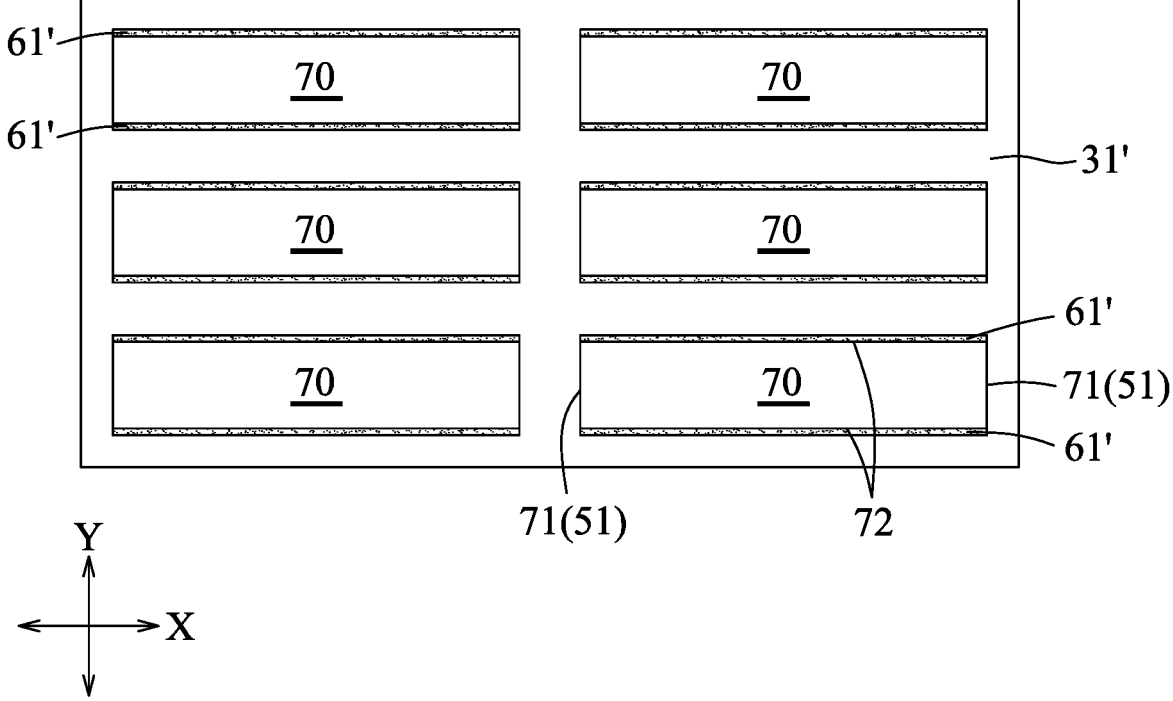

Referring to FIG. 1 and the example illustrated in FIGS. 17 to 21, the method proceeds to step 106, where the conductive elements 70 are formed. FIGS. 17 to 18 show the structure respectively subsequent to those shown in FIGS. 14 to 15, and are respectively the X-cut and the Y-cut of the structure. FIGS. 19 to 20 show the structure subsequent to those shown in FIGS. 17 to 18, and are respectively the X-cut and the Y-cut of the structure after completing step 106. FIG. 21 is the top view of the structure after completing step 106.

In accordance with some embodiments, step 106 may include the following sub-steps: (i) depositing an electrically conductive material layer 70A (see FIGS. 17 and 18, for forming the conductive elements 70 shown in FIGS. 19 to 21) over the reinforcing spacers 61 to fill the trenches 50 (see FIGS. 14 to 16), and over the patterned first dielectric layer 31 and the mask 40; and (ii) performing a planarization process to remove the mask 40, a portion of the patterned first dielectric layer 31, a portion of the two reinforcing spacers 61 and a portion of the electrically conductive material layer 70A, thereby obtaining the conductive elements 70.

In sub-step (i) of step 106, the deposition of the electrically conductive material layer 70A may be performed using any suitable process, such as CVD, ALD, or the like, or combination thereof, but are not limited thereto. The electrically conductive material layer 70A may include copper (Cu), silver (Ag), gold (Au), aluminum (Al), nickel (Ni), cobalt (Co), ruthenium (Ru), iridium (Ir), platinum (Pt), palladium (Pd), osmium (Os), tungsten (W), molybdenum (Mo), tantalum (Ta), or the like, or combinations thereof, but are not limited thereto. In sub-step (ii) of step 106, the planarization process may be a chemical-mechanical polishing (CMP) process, but is not limited thereto. By completing sub-step (ii), the patterned first dielectric layer 31' has a reduced height comparing with the patterned first dielectric layer 31 before the planarization process; and the reinforcing spacers 61' have a reduced length along the patterned first dielectric layer 31' comparing with the reinforcing spacers 61 before the planarization process. The electrically conductive material layer 70A also has a reduced height after the planarization process and is thereby formed into the conductive elements 70. The conductive elements 70 fill the trenches 50 by penetrating through the patterned first dielectric layer 31' and the patterned etch stop layer 21, and by covering the reinforcing spacers 61'. The interconnect structure of the present disclosure is thus obtained. Other suitable materials and/or processes for forming the conductive elements 70 are within the contemplated scope of the present disclosure. In some embodiments, the interconnect structure may also be further processed, such as forming another etch stop layer similar to that of the ESL 20, followed by forming other level of the BEOL section.

Each of the conductive elements 70 has two first surfaces 71 each confronting an adjacent one of the conductive elements 70 in the X direction, and two second surfaces 72 each confronting an adjacent one of the conductive elements 70 in the Y direction. A bottom surface of the conductive elements 70 is connected to the ILD 10. In some embodiments, the conductive elements 70 are permitted to be electrically connected with the metal vias 11 or other suitable features embedded in the ILD 10 (see FIG. 20). The conductive elements 70 are respectively sandwiched by multiple pairs of the reinforcing spacers 61'. In other words, each pair of the reinforcing spacers 61' are respectively formed on the two second surfaces 72 of a respective one of the conductive elements 70, and are formed between the patterned first dielectric layer 31' and the respective one of the conductive elements 70 in the Y direction. As such, for each of the conductive elements 71, the two first surfaces 71 are directly connected to the patterned first dielectric layer 31' in the X direction, while the two second surfaces 72 are indirectly connected to the patterned first dielectric layer 31' through the respective pair of the reinforcing spacers 61' in the Y direction.

A distance between two adjacent ones of the conductive elements 70 along the X direction is equivalent to the distance (C) described with reference to FIG. 4. A distance between two adjacent ones of the conductive elements 70 along the Y direction is equivalent to the distance (D) described with reference to FIG. 4. Along the Y direction, in which the conductive elements are more densely packed, each of the conductive elements 70 confronts an adjacent one of the conductive elements 70 through the damaged patterned first dielectric layer 31', and the corresponding undamaged reinforcing spacers 61' with a relatively low dielectric constant (comparing with the damaged patterned first dielectric layer 31'). As such, the interconnect structure produced thereby may have a relatively low capacitance performance.

The conductive elements 70 may serve as metal lines (also denoted by numeral 70) of the interconnect structure, in which a critical dimension (CD) of the metal lines measured along the Y direction is adjustable by adjusting a thickness of the reinforcing spacers 61', which is equivalent to the thickness (T) of the second dielectric layer 60 (see FIGS. 8 to 10) formed in step 103. By increasing (or decreasing) the thickness (T) of the second dielectric layer 60, the CD of the metal lines 70 may be reduced (or increased). That is, the inclusion of the reinforcing spacers 61' further allows easy control of the CD of the metal lines 70 of the interconnect structure of the present disclosure.

The embodiments of the present disclosure have the following advantageous features. The directional etching process is adopted to form the reinforcing spacers 61' that are made of a low dielectric constant material and that remain substantially intact during the directional etching process, thereby allowing such reinforcing spacers 61' to have the dielectric constant substantially the same as that before the directional etching process. The inclusion of the low dielectric constant reinforcing spacers 61' keeps the capacitance of the interconnect structure of the present disclosure low, especially along the Y direction that has denser pitches. In addition, adjustment of the thickness of the low dielectric constant reinforcing spacers 61' permits better control of the critical dimension (CD) of the conductive elements 70.

In accordance with some embodiments of the present disclosure, a method for manufacturing an interconnect structure includes: forming a first dielectric layer on a base structure; forming a mask on the first dielectric layer; patterning the first dielectric layer through the mask to form a trench in the patterned first dielectric layer, an inner surface of the trench having two first portions opposite to each other along an X direction, two second portions opposite to each other along a Y direction transverse to the X direction, and a bottom portion; forming two reinforcing spacers respectively on the two second portions of the trench such that the bottom portion and the two first portions of the trench are exposed from the two reinforcing spacers; and forming a trench-filling element in the trench to cover the two reinforcing spacers.

In accordance with some embodiments of the present disclosure, forming the two reinforcing spacers includes: forming a second dielectric layer along the inner surface of the trench; and removing a first part of the second dielectric layer located on the two first portions and the bottom portion, such that a second part of the second dielectric layer which remains on the two second portions serves as the two reinforcing spacers.

In accordance with some embodiments of the present disclosure, the second dielectric layer is conformally formed over the patterned first dielectric layer, the mask, and along the inner surface of the trench.

In accordance with some embodiments of the present disclosure, the first part of the second dielectric layer is removed using a directional etching process.

In accordance with some embodiments of the present disclosure, in the directional etching process, a ratio of a first etching rate of the first part of the second dielectric layer along the X direction to a second etching rate of the second part of the second dielectric layer along the Y direction is greater than 10.

In accordance with some embodiments of the present disclosure, the base structure includes an etch stop layer on which the first dielectric layer is formed; and in patterning the first dielectric layer, a portion of the etch stop layer is exposed from the trench to serve as the bottom portion.

In accordance with some embodiments of the present disclosure, the method further comprising, after forming the two reinforcing spacers, removing a portion of the etch stop layer exposed from the trench such that an underlying element of the base structure is exposed from trench, and in forming the trench-filling element, a bottom surface of the trench-filling element is connected to the underlying element.

In accordance with some embodiments of the present disclosure, forming the trench-filling element includes depositing an electrically conductive material layer over the two reinforcing spacers and the patterned first dielectric layer, and performing a planarization process to remove the mask, a portion of the patterned first dielectric layer, a portion of the two reinforcing spacers and a portion of the electrically conductive material layer.

In accordance with some embodiments of the present disclosure, the two reinforcing spacers are each formed with a thickness ranging from 10 Å to 200 Å.

In accordance with some embodiments of the present disclosure, the two reinforcing spacers have a dielectric constant lower than that of the patterned first dielectric layer.

In accordance with some embodiments of the present disclosure, a method for manufacturing an interconnect structure includes: forming a first dielectric layer on a base structure; forming a mask on the first dielectric layer; patterning the first dielectric layer through the mask to form a trench in the patterned first dielectric layer, an inner surface of the trench having two first portions opposite to each other along an X direction, two second portions opposite to each other along a Y direction transverse to the X direction, and a bottom portion; forming a second dielectric layer over the mask and the patterned first dielectric layer, and along an inner surface of the trench; etching the second dielectric layer by directing an etchant in a predetermined direction such that a first part of the second dielectric layer on the two first portions and the bottom portion is removed, and a second part of the second dielectric layer on the two second portions of the trench remains and is formed into two reinforcing spacers; and forming a trench-filling element in the trench to cover the two reinforcing spacers.

In accordance with some embodiments of the present disclosure, the second dielectric layer is etched using an ion beam etching process.

In accordance with some embodiments of the present disclosure, the ion beam etching process is performed with a power ranging from 100 W to 3000 W.

In accordance with some embodiments of the present disclosure, the ion beam etching process is performed with a bias not greater than 20 kV.

In accordance with some embodiments of the present disclosure, in etching the second dielectric layer, a ratio of an etching rate of the first part of the second dielectric layer to an etching rate of the mask is greater than 5.

In accordance with some embodiments of the present disclosure, the base structure includes an etch stop layer on which the first dielectric layer is formed; and in patterning the first dielectric layer, a portion of the etch stop layer is exposed from the trench to serve as a bottom portion.

In accordance with some embodiments of the present disclosure, the method further comprising, after etching the second dielectric layer, removing the portion of the etch stop layer exposed from the trench such that an underlying element of the base structure is exposed from the trench, and in forming the trench-filling element, a bottom surface of the trench-filling element is connected to the underlying element.

In accordance with some embodiments of the present disclosure, in etching the second dielectric layer, a ratio of an etching rate of the first part of the second dielectric layer to an etching rate of the etch stop layer is greater than 7.

In accordance with some embodiments of the present disclosure, an interconnect structure includes a patterned first dielectric layer, conductive elements, and multiple pairs of reinforcing spacers. The conductive elements are disposed in the patterned first dielectric layer and arranged in an array. Each of the conductive elements has two first surfaces each confronting an adjacent one of the conductive elements in an X direction, and two second surfaces each confronting an adjacent one of the conductive elements in a Y direction transverse to the X direction. Each pair of the reinforcing spacers are respectively formed on the two second surfaces of a respective one of the conductive elements, and each pair of the reinforcing spacers are formed between the patterned first dielectric layer and the respective one of the conductive elements such that the two first surfaces of each of the conductive elements are directly connected to the patterned first dielectric layer. The multiple pairs of the reinforcing spacers have a dielectric constant lower than that of the patterned first dielectric layer.

In accordance with some embodiments of the present disclosure, the interconnect structure further includes a patterned etch stop layer disposed on a bottom surface of the patterned first dielectric layer. The conductive elements each penetrate through the patterned first dielectric layer and the patterned etch stop layer.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an interconnect structure, comprising:

forming a first dielectric layer on a base structure;

forming a mask on the first dielectric layer;

patterning the first dielectric layer through the mask to form a trench in the patterned first dielectric layer, an inner surface of the trench having two first portions opposite to each other along an X direction, two second portions opposite to each other along a Y direction transverse to the X direction, and a bottom portion;

forming two reinforcing spacers respectively on the two second portions of the trench such that the bottom portion and the two first portions of the trench are exposed from the two reinforcing spacers; and forming a trench-filling element in the trench to cover the two reinforcing spacers.

2. The method according to claim 1, wherein forming the two reinforcing spacers includes:

forming a second dielectric layer along the inner surface of the trench; and removing a first part of the second dielectric layer located on the two first portions and the bottom portion, such that a second part of the second dielectric layer which remains on the two second portions serves as the two reinforcing spacers.

3. The method according to claim 2, wherein the second dielectric layer is conformally formed over the patterned first dielectric layer, the mask, and along the inner surface of the trench.

4. The method according to claim 2, wherein the first part of the second dielectric layer is removed using a directional etching process.

5. The method according to claim 4, wherein in the directional etching process, a ratio of a first etching rate of the first part of the second dielectric layer along the X direction to a second etching rate of the second part of the second dielectric layer along the Y direction is greater than 10.

6. The method according to claim 1, wherein:

the base structure includes an etch stop layer on which the first dielectric layer is formed; and in patterning the first dielectric layer, a portion of the etch stop layer is exposed from the trench to serve as the bottom portion.

7. The method according to claim 6, further comprising, after forming the two reinforcing spacers, removing a portion of the etch stop layer exposed from the trench such that an underlying element of the base structure is exposed from trench, and in forming the trench-filling element, a bottom surface of the trench-filling element is connected to the underlying element.

8. The method according to claim 1, wherein forming the trench-filling element includes depositing an electrically conductive material layer over the two reinforcing spacers and the patterned first dielectric layer, and performing a planarization process to remove the mask, a portion of the patterned first dielectric layer, a portion of the two reinforcing spacers and a portion of the electrically conductive material layer.

9. The method according to claim 1, wherein the two reinforcing spacers are each formed with a thickness ranging from 10 Å to 200 Å.

10. The method according to claim 1, wherein the two reinforcing spacers have a dielectric constant lower than that of the patterned first dielectric layer.

11. A method for manufacturing an interconnect structure, comprising:

forming a first dielectric layer on a base structure;

forming a mask on the first dielectric layer;

patterning the first dielectric layer through the mask to form a trench in the patterned first dielectric layer, an inner surface of the trench having two first portions opposite to each other along an X direction, two second portions opposite to each other along a Y direction transverse to the X direction, and a bottom portion;

forming a second dielectric layer over the mask and the patterned first dielectric layer, and along an inner surface of the trench;

etching the second dielectric layer by directing an etchant in a predetermined direction such that a first part of the second dielectric layer on the two first portions and the bottom portion is removed, and a second part of the second dielectric layer on the two second portions of the trench remains and is formed into two reinforcing spacers; and forming a trench-filling element in the trench to cover the two reinforcing spacers.

12. The method according to claim 11, wherein the second dielectric layer is etched using an ion beam etching process.

13. The method according to claim 12, wherein the ion beam etching process is performed with a power ranging from 100 W to 3000 W.

14. The method according to claim 12, wherein the ion beam etching process is performed with a bias not greater than 20 kV.

15. The method according to claim 11, wherein, in etching the second dielectric layer, a ratio of an etching rate of the first part of the second dielectric layer to an etching rate of the mask is greater than 5.

16. The method according to claim 11, wherein:

the base structure includes an etch stop layer on which the first dielectric layer is formed; and in patterning the first dielectric layer, a portion of the etch stop layer is exposed from the trench to serve as a bottom portion.

17. The method according to claim 16, further comprising, after etching the second dielectric layer, removing the portion of the etch stop layer exposed from the trench such that an underlying element of the base structure is exposed from the trench, and in forming the trench-filling element, a bottom surface of the trench-filling element is connected to the underlying element.

18. The method according to claim 16, wherein, in etching the second dielectric layer, a ratio of an etching rate of the first part of the second dielectric layer to an etching rate of the etch stop layer is greater than 7.

19. An interconnect structure, comprising:

a patterned first dielectric layer;

conductive elements disposed in the patterned first dielectric layer and arranged in an array, each of the conductive elements having two first surfaces each confronting an adjacent one of the conductive elements in an X direction, two second surfaces each confronting an adjacent one of the conductive elements in a Y direction transverse to the X direction; and multiple pairs of reinforcing spacers, each pair of which are respectively formed on the two second surfaces of a respective one of the conductive elements, and each pair of which are formed between the patterned first dielectric layer and the respective one of the conductive elements such that the two first surfaces of each of the conductive elements are directly connected to the patterned first dielectric layer, the multiple pairs of the reinforcing spacers having a dielectric constant lower than that of the patterned first dielectric layer.

20. The interconnect structure according to claim 19, further comprising a patterned etch stop layer disposed on a bottom surface of the patterned first dielectric layer, the conductive elements each penetrating through the patterned first dielectric layer and the patterned etch stop layer.

\* \* \* \* \*